United States Patent
Shibayama et al.

(10) Patent No.: US 7,326,907 B2
(45) Date of Patent: Feb. 5, 2008

(54) WIRING SUBSTRATE AND RADIATION DETECTOR USING SAME

(75) Inventors: Katsumi Shibayama, Hamamatsu (JP); Yutaka Kusuyama, Hamamatsu (JP); Masahiro Hayashi, Hamamatsu (JP)

(73) Assignee: Hamamatsu Photonics K.K., Shizuoka (JP)

(*) Notice: Subject to any disclaimer, the term of this patent is extended or adjusted under 35 U.S.C. 154(b) by 0 days.

(21) Appl. No.: 10/541,616

(22) PCT Filed: Jan. 8, 2004

(86) PCT No.: PCT/JP2004/000077

§ 371 (c)(1),
(2), (4) Date: Jul. 21, 2006

(87) PCT Pub. No.: WO2004/064162

PCT Pub. Date: Jul. 29, 2004

(65) Prior Publication Data

US 2006/0267195 A1 Nov. 30, 2006

(30) Foreign Application Priority Data

Jan. 8, 2003 (JP) ............................. 2003-002504

(51) Int. Cl.
H01L 31/00 (2006.01)
H01L 23/48 (2006.01)
G01T 1/20 (2006.01)

(52) U.S. Cl. ............................. 250/214.1; 250/370.11; 257/774

(58) Field of Classification Search ................ 250/216, 250/208.1, 214.1, 370.09, 370.11; 257/734, 257/774, 776, 777, 432, 435
See application file for complete search history.

(56) References Cited

U.S. PATENT DOCUMENTS

| 2002/0038851 A1 | 4/2002 | Kajiwara et al. |
| 2006/0244153 A1* | 11/2006 | Shibayama et al. ......... 257/777 |

FOREIGN PATENT DOCUMENTS

| EP | 1 492 168 | 12/2004 |
| JP | 06-347480 | 12/1994 |
| JP | 8-8414 | 1/1996 |
| JP | 08-330469 | 12/1996 |
| JP | 2002-359446 | 12/2002 |
| JP | 2003-264280 | 9/2003 |
| JP | 2003-282849 | 10/2003 |
| WO | WO 91/10921 | 7/1991 |

* cited by examiner

Primary Examiner—Kevin Pyo
(74) Attorney, Agent, or Firm—Drinker Biddle & Reath LLP

(57) ABSTRACT

A wiring substrate section 2, which has a wiring substrate 20 with through holes 20c each filled with a conductive member 21 serving as a conduction path for guiding a detected signal, is installed between a radiation detecting section 1 comprised of a scintillator 10 and a PD array 15, and a signal processing element 30 for processing the detected signals outputted from the PD array 15. Each through hole 20c in the wiring substrate 20 is formed so that, with respect to a predetermined plane perpendicular to a conduction direction from an input surface 20a to an output surface 20b, an aperture of the through hole 20c in that plane is not on an extension along the conduction direction of an aperture of the through hole 20c in the input surface 20a and so that the through hole 20c cannot be seen through from the input surface 20a to the output surface 20b. This obtains the wiring substrate capable of suppressing transmission of radiation, and a radiation detector using it.

11 Claims, 8 Drawing Sheets

WIRING SUBSTRATE AND RADIATION DETECTOR USING SAME

TECHNICAL FIELD

The present invention relates to a wiring substrate provided with conduction paths for guiding an electric signal, and a radiation detector using it.

BACKGROUND ART

As a radiation detector used for CT sensors and others, there is a detector of a configuration wherein, with respect to a semiconductor photodetecting element array such as a photodiode array, a scintillator is installed on a light-incident surface of the photodetecting element array. In the radiation detector of this type, when the radiation such as X-rays, γ-rays, or charged particles, which is an object to be detected, is made incident on the scintillator, the radiation generates scintillation light in the scintillator. Then the semiconductor photodetecting elements detect this scintillation light, thereby detecting the radiation.

With respect to the photodetecting element array, a signal processing element is provided in order to perform signal processing of detected signals outputted from the respective photodetecting elements. In this case, as a configuration for electrically connecting the photodetecting elements to the signal processing element, it is possible to use a configuration for connecting them by various wires, a configuration for connecting them through conduction paths provided in a wiring substrate, and so on (e.g., reference is made to Japanese Patent Application Laid-Open No. 8-330469).

DISCLOSURE OF THE INVENTION

In the above-described radiation detector, part of the radiation incident on the scintillator normally passes through the scintillator and the photodetecting element array. In this connection, in a configuration wherein the scintillator, the photodetecting element array, the wiring substrate, and the signal processing element are arranged along a predetermined alignment direction, there arises a problem that the radiation having passed through the scintillator and others is incident through the wiring substrate into the signal processing element located downstream in the alignment direction. This incidence of the radiation into the signal processing element will lead to radiation damage of the signal processing element and, in turn, to degradation of the reliability and lifetime of the radiation detector.

The present invention has been accomplished in order to solve the above problem and an object of the invention is to provide a wiring substrate capable of suppressing transmission of radiation, and a radiation detector using it.

In order to achieve the above object, a wiring substrate according to the present invention is a wiring substrate provided with a conduction path for guiding an electric signal between a signal input surface and a signal output surface, (1) the wiring substrate comprising a glass substrate made of a predetermined glass material having a radiation shielding function, and provided with a through hole, and a conductive member provided in the through hole and establishing electrical continuity between the input surface and the output surface to function as the conduction path, (2) wherein the through hole in the glass substrate is formed so that an aperture of the through hole in a predetermined plane perpendicular to a conduction direction from the signal input surface toward the signal output surface is within a region except for a region on an extension along the conduction direction of an aperture of the through hole in the signal input surface.

The above-described wiring substrate, which is the wiring substrate to be used for electrical connection between radiation detecting means and signal processing means in a radiation detector or the like, is constructed using the glass substrate made of the predetermined glass material. The through hole of the conduction path provided in the glass substrate is configured so that the aperture in the predetermined plane is not on the extension of the aperture in the signal input surface, i.e., so that the through hole cannot be seen through from the signal input surface to the signal output surface, when viewed from the conduction direction perpendicular to the signal input surface.

In this configuration, when viewed from the conduction direction, the glass material having the radiation shielding function is present somewhere between the signal input surface and the signal output surface, even in the region where the through hole is provided in the glass substrate. This substantializes the wiring substrate capable of suppressing the transmission of radiation in total.

A specific configuration of the wiring substrate is, for example, a configuration wherein the through hole in the glass substrate is formed so that a center line thereof is inclined at a predetermined angle relative to the conduction direction. This configuration can achieve the configuration wherein, where the signal output surface is defined as the aforementioned predetermined plane, at least the aperture in that plane is not on the extension of the aperture in the signal input surface.

Another configuration is one wherein the through hole in the glass substrate is formed so that a center line thereof is curved relative to the conduction direction. This configuration can achieve the configuration wherein, where a plane between the signal input surface and the signal output surface is defined as the aforementioned predetermined plane, at least the aperture in that plane is not on the extension of the aperture in the signal input surface.

Concerning the glass material used for the wiring substrate, it is preferable to adopt a configuration wherein the glass substrate is made of the glass material containing lead. This can effectively suppress the transmission of radiation in the wiring substrate. It is also possible to use a substrate made of another glass material having the radiation shielding function.

The conduction path in the wiring substrate may be configured in a configuration wherein the conductive member is provided so as to be formed on an inner wall of the through hole in the glass substrate. Another possible configuration is such that the conductive member is provided so as to be filled inside the through hole in the glass substrate. When the conductive member in these configurations is used as the conduction path, the electric signal can be suitably transmitted between the signal input surface and the signal output surface of the wiring substrate.

The glass substrate in the wiring substrate is preferably a glass substrate with a plurality of through holes made by fusing together and integrally forming a plurality of hollow glass members opening at both ends. It is also possible to use a substrate in configurations other than it.

A radiation detector according to the present invention is a radiation detector comprising: (1) radiation detecting means for detecting an incident radiation and outputting a detected signal; (2) signal processing means for processing the detected signal from the radiation detecting means; and (3) a wiring substrate section having the above-described wiring substrate provided with the conduction path for guiding the detected signal between the signal input surface and the signal output surface, in which the radiation detecting means and the signal processing means are connected to the signal input surface and to the signal output surface, respectively; (4) wherein the radiation detecting means, the wiring substrate section, and the signal processing means are arranged in that order along a predetermined alignment direction substantially coincident with the conduction direction in the wiring substrate.

In the above-described radiation detector, the wiring substrate of the above-described configuration wherein the through hole cannot be seen through from the signal input surface to the signal output surface is used as the wiring substrate section electrically connecting the radiation detecting means to the signal processing means and transmitting the detected signal being an electric signal. In this configuration, the glass material having the radiation shielding function exists at least in a part of the path from the signal input surface to the signal output surface, everywhere in the wiring substrate section. This substantializes the radiation detector in which the radiation does not enter the signal processing element, so as to suppress the degradation of the reliability and lifetime due to the radiation damage.

The configuration of the radiation detecting means can be a configuration wherein the radiation detecting means has a scintillator for generating scintillation light upon incidence of the radiation, and a semiconductor photodetecting element for detecting the scintillation light from the scintillator. Another possible configuration is such that the radiation detecting means has a semiconductor detecting element for detecting the incident radiation.

It is also preferable to adopt a configuration wherein at least one of a set of the wiring substrate section and the radiation detecting means, and a set of the wiring substrate section and the signal processing means are electrically connected through a bump electrode. When such a metal bump electrode is used as electric connection means, the sections can be suitably electrically connected.

BEST MODE FOR CARRYING OUT THE INVENTION

Figure 1:
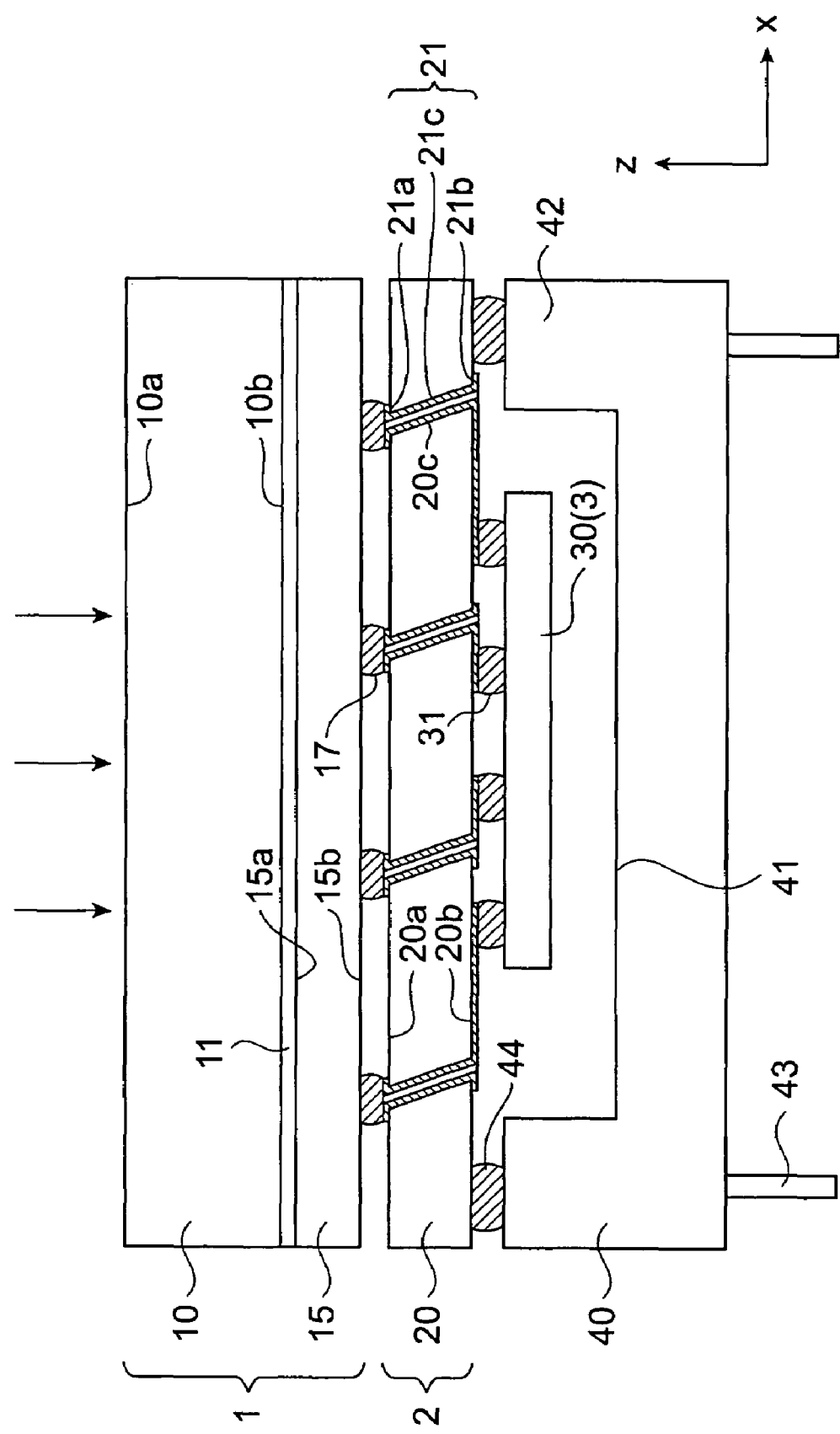
FIG. 1 is a sectional side view showing a sectional structure of an embodiment of a wiring substrate, and a radiation detector using it.

The preferred embodiments of the wiring substrate according to the present invention, and the radiation detector using it will be described below in detail with reference to the drawings. The same elements will be denoted by the same reference symbols in the description of the drawings, without redundant description. It is noted that dimensional ratios in the drawings do not always agree with those in the description.

Figure 2:
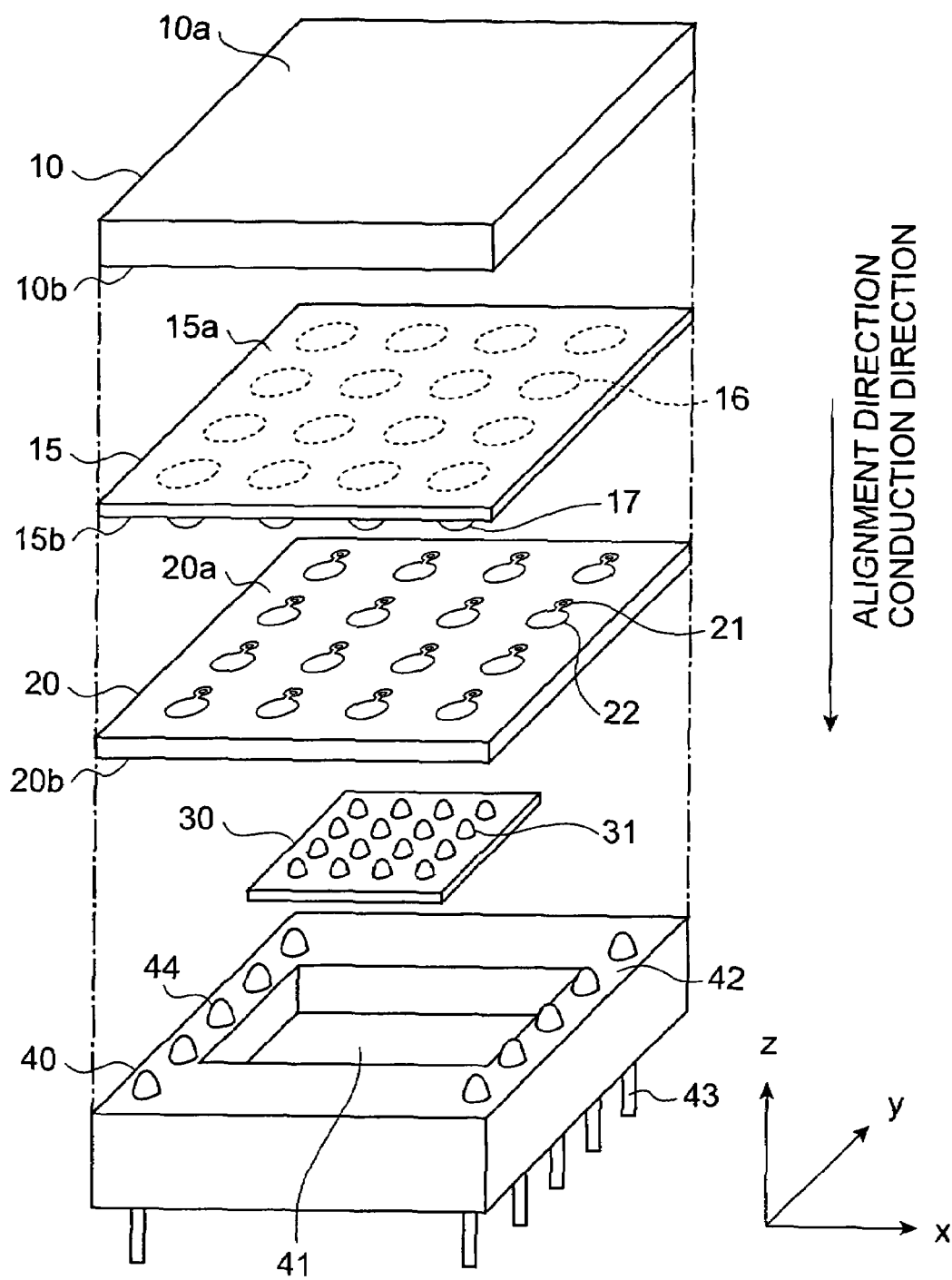
FIG. 2 is an exploded perspective view of a configuration of the radiation detector shown in FIG. 1.

FIG. 1 is a sectional side view showing a sectional structure of an embodiment of the wiring substrate and the radiation detector according to the present invention. FIG. 2 is an exploded perspective view of components in the configuration of the wiring substrate and the radiation detector shown in FIG. 1. In each of the drawings hereinafter, an axis along a direction of incidence of radiation is defined as z-axis, and two axes perpendicular to this z-axis are defined as x-axis and y-axis, as shown in FIGS. 1 and 2, for the convenience of description. In this definition, the negative direction of the z-axis is a conduction direction from the signal input surface toward the signal output surface in the wiring substrate, and alignment direction of the components in the radiation detector.

The radiation detector shown in FIG. 1 is provided with a radiation detecting section 1, a wiring substrate section 2, and a signal processing section 3. These are arranged in that order from the upstream (the upper side in the drawing) to the downstream (the lower side) along the predetermined alignment direction, as shown in FIG. 2.

The radiation detecting section 1 is a detecting means for detecting the radiation such as X-rays, y-rays, or charged particles incident as an object to be detected, into the present radiation detector and for outputting detected signals being electric signals corresponding thereto. In the present embodiment, the radiation detecting section 1 is composed of a scintillator 10 and a photodiode array 15.

The scintillator 10 constitutes the upstream part of the radiation detecting section 1, and an upper surface 10a thereof serves as a radiation-incident surface in the present radiation detector. This scintillator 10 generates scintillation light of a predetermined wavelength upon incidence of the radiation through the incidence surface 10a.

The photodiode array (PD array) 15 constitutes the downstream part of the radiation detecting section 1. This PD array 15 is a photodetecting element array in which a plurality of photodiodes (PDs) being semiconductor photodetecting elements for detecting the scintillation light from the scintillator 10 are arrayed. A light exit surface 10b being the lower surface of the scintillator 10 is optically coupled to a light-incident surface 15a being the upper surface of the PD array 15, through an optical adhesive 11 that transmits the scintillation light.

FIG. 2 shows the PD array in which 4×4=16 photodiodes 16 are two-dimensionally arrayed along arrangement axes of the x-axis and the y-axis, as a configuration example of the PD array 15. The lower surface 15b of the PD array 15 serves as a signal output surface for outputting a detected signal from each photodiode 16. On this lower surface 15b, there are sixteen bump electrodes 17 being electrodes for output of detected signals, provided in the 4×4 array corresponding to the respective photodiodes 16. Although not shown in particular, there is also provided a bump electrode for a common electrode to the photodiodes.

The wiring substrate section 2 is installed downstream of the radiation detecting section 1. In the present embodiment, the wiring substrate section 2 is composed of a wiring substrate 20 provided with conduction paths for guiding electric signals between its signal input surface and signal output surface. In this wiring substrate 20, a glass substrate made of a predetermined glass material having the radiation shielding function is used as a substrate. The glass material of this type is preferably, for example, lead glass containing lead.

Figure 3A:
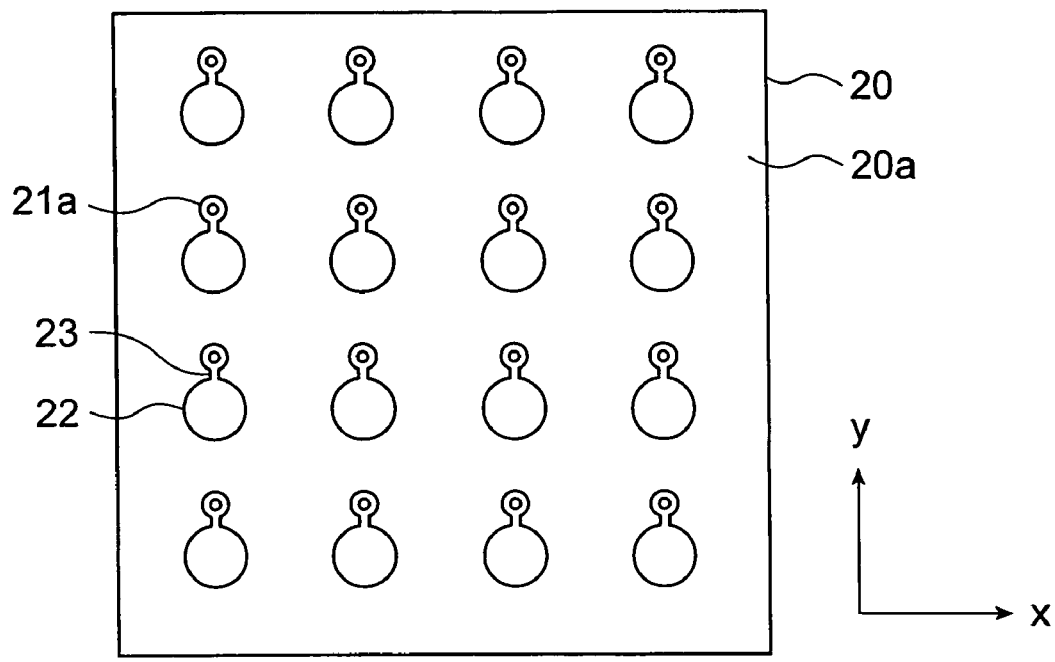
FIGS. 3A and 3B are plan views showing configurations of (A) a signal input surface and (B) a signal output surface of the wiring substrate.
Figure 3B:
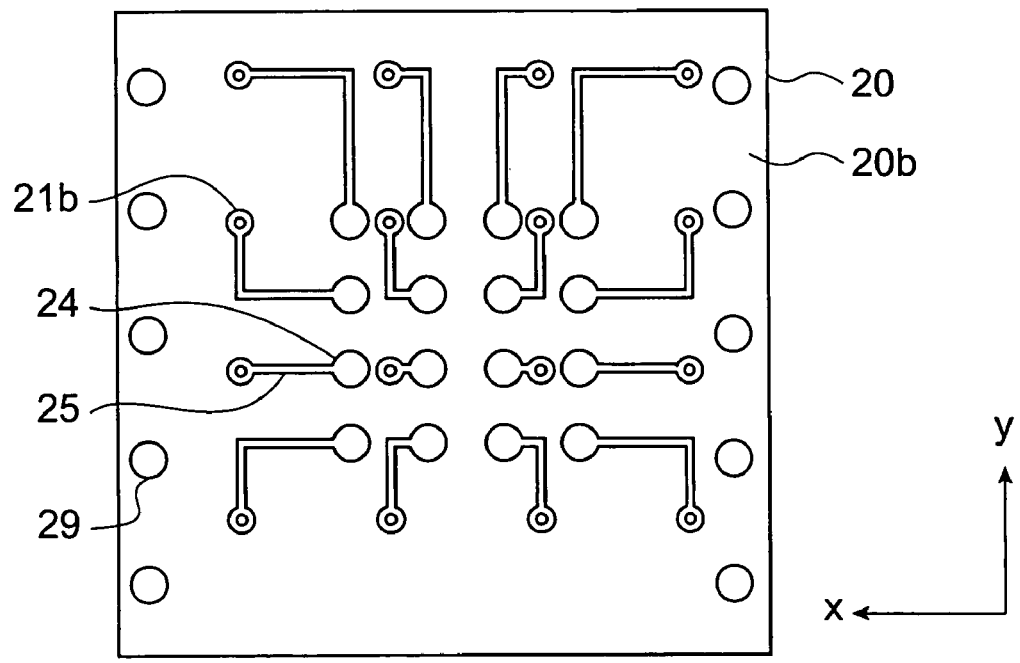

FIGS. 3A and 3B are plan views showing the configuration of the wiring substrate 20, wherein FIG. 3A shows the signal input surface 20a being the upper surface of the wiring substrate 20 and FIG. 3B the signal output surface 20b being the lower surface of the wiring substrate 20.

The glass substrate forming the wiring substrate 20 is provided with a plurality of through holes 20c formed between the input surface 20a and the output surface 20b. Each through hole 20c is provided with a conductive member 21 functioning as a conduction path to establish electrical continuity between the input surface 20a and the output surface 20b. In the present embodiment sixteen through holes 20c and conductive members 21 are provided in a 4×4 matrix corresponding to the configuration of the PD array 15. These through holes 20c and conductive members 21 are formed at the same pitch as the bump electrodes 17 are on the PD array 15. Although not shown in particular, there are also provided a through hole and a conductive member for the common electrode to the photodiodes.

Each conductive member 21 is specifically comprised of a conduction portion 21c formed inside the through hole 20c, an input portion 21a formed on the input surface 20a so as to be continuous to the conduction portion 21c around the periphery of the through hole 20c, and an output portion 21b formed on the output surface 20b so as to be continuous to the conduction portion 21c around the periphery of the through hole 20c.

Each through hole 20c in the glass substrate of the wiring substrate 20 is formed so that, with respect to a predetermined plane perpendicular to the conduction direction from the signal input surface 20a toward the signal output surface 20b, an aperture of the through hole 20c in that plane is within a region except for a region on an extension along the conduction direction of the aperture of the through hole 20c in the signal input surface 20a In the configuration shown in FIG. 1, specifically, where the signal output surface 20b, or a plane near it is defined as the predetermined plane, the sectional aperture of the through hole 20c in that plane is arranged not to be on the extension of the aperture in the signal input surface 20a. The conduction direction in the wiring substrate 20 is approximately coincident with the alignment direction of the components in the radiation detector, as shown in FIG. 2.

Electrode pads 22 are formed in addition to the input portions 21a of the conductive members 21, as shown in FIG. 3A, on the input surface 20a of the wiring substrate 20. The electrode pads 22 are provided at positions corresponding to the bump electrodes 17 on the output surface 15b of the PD array 15. Each of the electrode pads 22 is electrically connected to the input portion 21a of the corresponding conductive member 21 through a wiring 23. In this configuration, each photodiode 16 for outputting a detected signal in the PD array 15 is electrically connected via the bump electrode 17 and electrode pad 22 to the conductive member 21 being a conduction path in the wiring substrate 20. Although not shown in particular, there is also provided an electrode pad for the common electrode to the photodiodes.

Electrode pads 24 are also formed in addition to the output portions 21b of the conductive members 21, as shown in FIG. 3B, on the output surface 20b of the wiring substrate 20. The electrode pads 24 are provided at positions corresponding to bump electrodes 31 of signal processing element 30 described hereinafter. Each electrode pad 24 is electrically connected to the output portion 21b of the corresponding conductive member 21 through a wiring 25. In addition, electrode pads 29 are also formed on the output surface 20b. These electrode pads 29 are used for connection with housing 40 described later. Although not shown in particular, there is also provided an electrode pad for the common electrode to the photodiodes.

The signal processing section 3 and housing (package) 40 are installed downstream of the wiring substrate section 2. In the present embodiment, the signal processing section 3 is comprised of a signal processing element 30 equipped with a signal processing circuit for processing detected signals from the PD array 15 in the radiation detecting section 1.

Bump electrodes 31 are formed on the upper surface of the signal processing element 30. These bump electrodes 31 are provided at positions corresponding to the electrode pads 24 on the output surface 20b of the wiring substrate 20. In this configuration, each conductive member 21 being a conduction path for transmitting a detected signal in the wiring substrate 20 is electrically connected to the signal processing circuit provided in the signal processing element 30, via the output portion 21b, wiring 25, electrode pad 24, and bump electrode 31.

The housing 40 is a holding member for integrally holding the radiation detecting section 1, wiring substrate section 2, and signal processing section 3. This housing 40 has an element housing part 41 provided as a recess on the upper surface thereof and arranged to receive the signal processing element 30 inside, and a support part 42 provided around the periphery of the element housing part 41, connected through bump electrodes 44 to the electrode pads 29 of the wiring substrate 20, and supporting the radiation detecting section 1, wiring substrate section 2, and signal processing section 3. Leads 43 used for input/output of electric signals from or to the outside are provided on the lower surface of the housing 40.

In the above configuration, when the radiation such as X-rays is made incident on the scintillator 10 of the radiation detecting section 1, the radiation generates scintillation light in the scintillator 10, and the scintillation light is incident through the optical adhesive 11 onto the photodiodes 16 of the PD array 15. The photodiodes 16 detect this scintillation light and output their respective detected signals being electric signals corresponding to the detection of the radiation.

The detected signals outputted from the respective photodiodes 16 of the PD array 15 are successively fed via the corresponding bump electrode 17, conductive member 21 of the wiring substrate 20, and bump electrode 31 to the signal processing element 30. Then the signal processing circuit of the signal processing element 30 performs necessary signal processing on the detected signals.

The effects of the wiring substrate and the radiation detector according to the present embodiment will be described below.

In the case of the wiring substrate used for the wiring substrate section 2 in the radiation detector shown in FIGS. 1-3A, 3B, the wiring substrate 20 used for electrical connection between the radiation detecting section and the signal processing section in the radiation detector and others is comprised of the glass substrate made of the predetermined glass material. Concerning each through hole 20c of the conduction path provided in the glass substrate, the aperture in the predetermined plane perpendicular to the conduction direction is arranged not to be on the extension of the aperture in the signal input surface 20a. Namely, when viewed from the conduction direction perpendicular to the signal input surface 20a, each through hole 20c is arranged not to be seen through from the signal input surface 20a to the signal output surface 20b.

In this configuration, when viewed from the conduction direction, the glass material having the radiation shielding function is present somewhere between the signal input surface 20a and the signal output surface 20b, even in the region where the through hole 20c is provided in the glass substrate of the wiring substrate 20. This substantializes the wiring substrate capable of suppressing the transmission of the radiation in total.

According to the radiation detector wherein the wiring substrate as described above is used in the wiring substrate section 2 electrically connecting the radiation detecting section 1 to the signal processing section 3 and transmitting the detected signals being the electric signals, the glass material having the radiation shielding function is present at least in a part of the path between the signal input surface 20a and the signal output surface 20b of the wiring substrate 20, everywhere on the wiring substrate section 2, when viewed from the alignment direction of the components in the radiation detector, approximately coincident with the conduction direction of the detected signals, i.e., when viewed from the direction of incidence of the radiation into the radiation detector. This prevents the radiation from entering the signal processing element and thus substantializes the radiation detector capable of securely suppressing the degradation of the reliability and lifetime due to the radiation damage.

The glass material used for the glass substrate in the wiring substrate 20 of the wiring substrate section 2 is preferably a glass material containing lead, as described above. The use of the lead glass enables effective suppression of the transmission of radiation in the wiring substrate section 2. Here the amount of lead included in the glass material is preferably properly set according to the level of the radiation shielding function required in the radiation detector and other factors. It is also possible to use glass materials other than the lead glass.

Next, an explanation will be given on the wiring substrate in the wiring substrate section shown in FIG. 1, and on the glass substrate used therein.

The wiring substrate 20, as described above, is constructed using the glass substrate provided with the through holes 20c for formation of the conductive members 21 as conduction paths between the input surface 20a on the radiation detecting section 1 side and the output surface 20b on the signal processing section 3 side. Such a glass substrate can be, for example, a glass substrate with a plurality of through holes made by fusing together and integrally forming a plurality of hollow glass members opening at both ends, to each other.

Figure 4A:
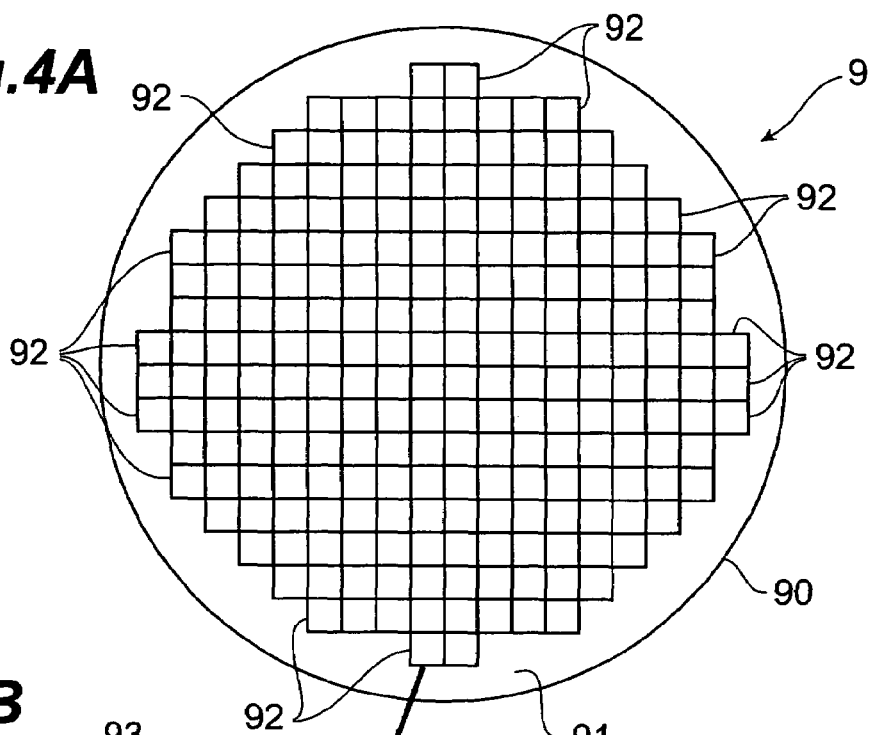
FIGS. 4A to 4C are illustrations showing an example of a glass substrate provided with a plurality of through holes.
Figure 4B:
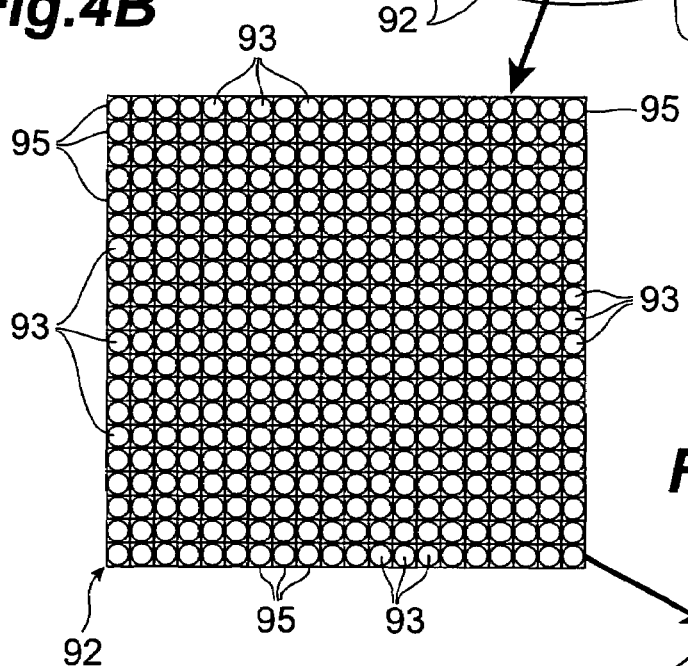
Figure 4C:
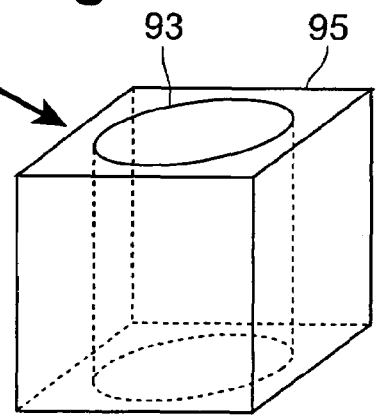

FIGS. 4A to 4C are illustrations showing an example of the above-described glass substrate provided with a plurality of through holes. Here is shown a general configuration example of the glass substrate having a plurality of through holes. For this reason, the glass substrate shown in FIGS. 4A to 4C is different in the shape and configuration from the wiring substrate used in the radiation detector shown in FIG. 1.

FIG. 4A is a plan view showing the configuration of the glass substrate, FIG. 4B a plan view showing a configuration of a multi-channel member included in the glass substrate, and FIG. 4C a perspective view showing a configuration of a glass member included in the multi-channel member. These FIGS. 4A to 4C show the glass substrate in a state without formation of the conductive members as conduction paths in the wiring substrate.

The glass substrate 9 has a capillary substrate 90, as shown in FIG. 4A. The capillary substrate 90 includes a plurality of multi-channel members 92 having a plurality of through holes 93. The multi-channel members 92 are fused to each other in a two-dimensionally arranged state to be integrated, inside an edge member 91 made of a glass material.

Each multi-channel member 92, as shown in FIGS. 4B and 4C, is constructed by fusing together and integrally forming a plurality of hollow glass members 95 opening at both ends, to each other, and has the square shape (e.g., approximately 1000 μm×1000 μm) when viewed from the direction normal to the upper surface and lower surface of the capillary substrate 90. Each through hole 93 has an aperture portion of circular shape. The inside diameter of the through hole 93 is, for example, approximately 6 μm.

The glass material of the edge member 91 and the glass members 95 forming the capillary substrate 90 is a glass material having the radiation shielding function, e.g., a lead glass material, as described above about the radiation detector.

The wiring substrate 20 in the radiation detector shown in FIG. 1 can be, for example, one in which a conductive member as a conduction path is formed in each through hole in the glass substrate having the configuration shown in FIGS. 4A to 4C. Namely, in the glass substrate of this configuration, the shape of the substrate, the number and arrangement of the through holes, etc. are set according to the configuration of the radiation detector. Then the conductive members as conduction paths are formed in the respective through holes in the glass substrate and an electric wiring pattern consisting of necessary electrodes and wirings is formed on each surface of the glass substrate, thereby obtaining the wiring substrate having the configuration as shown in FIGS. 3A and 3B.

Figure 5A:
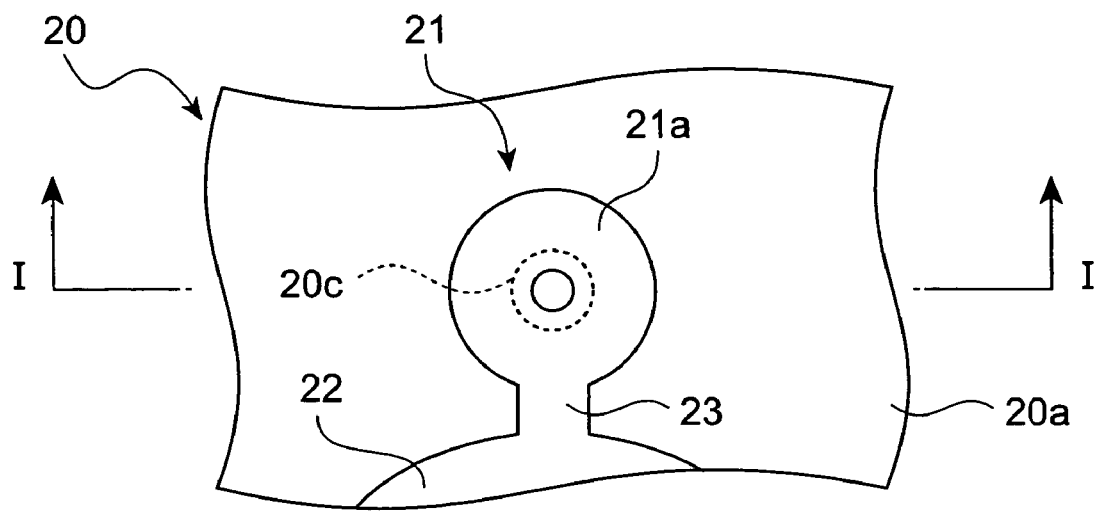
FIGS. 5A and 5B are illustrations showing an example of a configuration of a conductive member provided in a through hole of a wiring substrate.
Figure 5B:
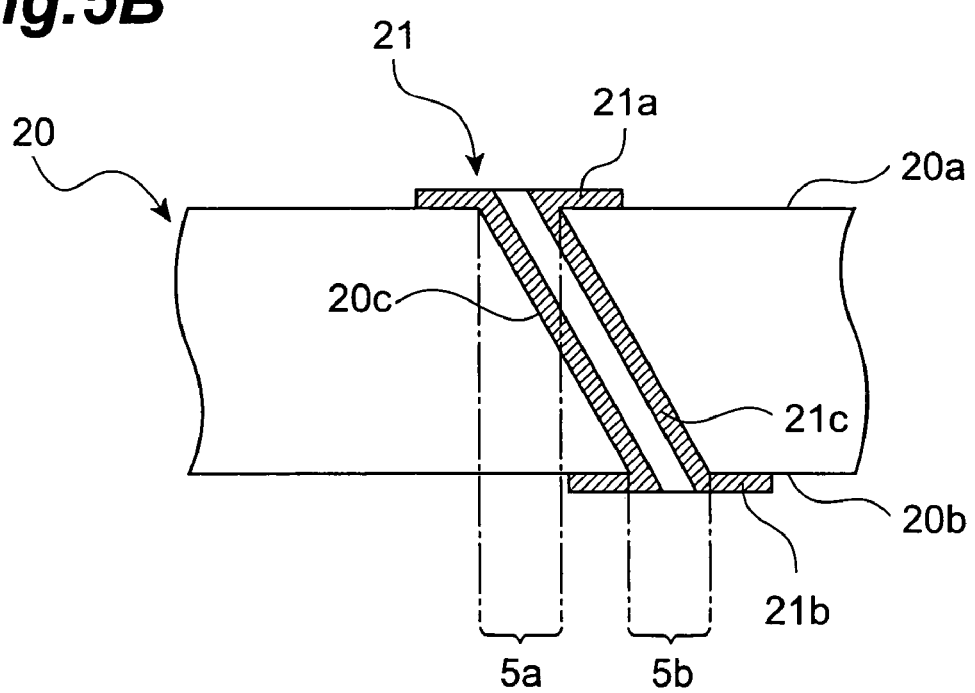

FIGS. 5A and 5B are illustrations showing an example of the configuration of the conductive member provided in each through hole in the wiring substrate, wherein FIG. 5A is a top plan view and FIG. 5B a sectional view taken along a line I-I and in a direction of arrows. These figures show the configuration of the conductive member 21 being a conduction path in the wiring substrate 20 (cf. FIGS. 3A and 3B).

In the wiring substrate 20, a plurality of (e.g., 4×4=16) through holes 20c are two-dimensionally arrayed and each through hole is formed in a circular sectional shape. In this configuration example, each through hole 20c, as shown in FIG. 5B, is formed so that the center line thereof is inclined at a predetermined angle relative to the conduction direction normal to the input surface 20a and the output surface 20b of the wiring substrate 20. Specifically, the through hole 20c is formed so that, with respect to the output surface 20b perpendicular to the conduction direction, the sectional aperture 5b of the through hole 20c in that plane is not on an extension of aperture 5a in the input surface 20a. In this configuration, the through hole 20c is arranged not to be seen through from the signal input surface 20a to the signal output surface 20b.

In this configuration example, this through hole 20c is provided with a conductive member 21 for establishing electrical continuity between the input surface 20a and the output surface 20b, as a member formed on the inner wall of the through hole 20c. Namely, a conduction portion 21c is formed on the inner wall in the through hole 20c. An input portion 21a continuous to the conduction portion 21c is formed around the periphery of the through hole 20c on the input surface 20a. An output portion 21b continuous to the conduction portion 21c is formed around the periphery of the through hole 20c on the output surface 20b. These conduction portion 21c, input portion 21a, and output portion 21b constitute the conductive member 21 as a conduction path in the wiring substrate 20.

Figure 6A:
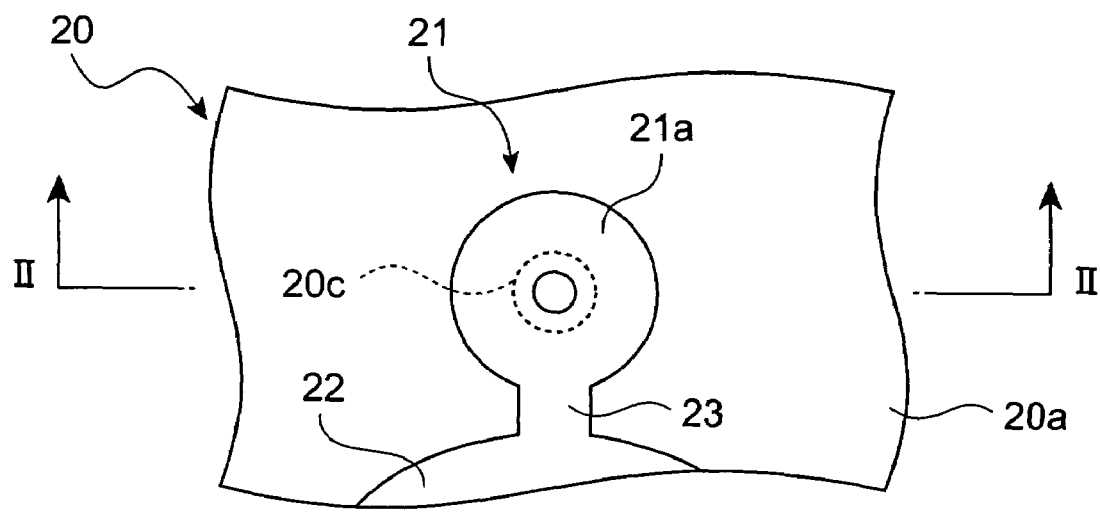
FIGS. 6A and 6B are illustrations showing another example of a configuration of a conductive member provided in a through hole of a wiring substrate.
Figure 6B:
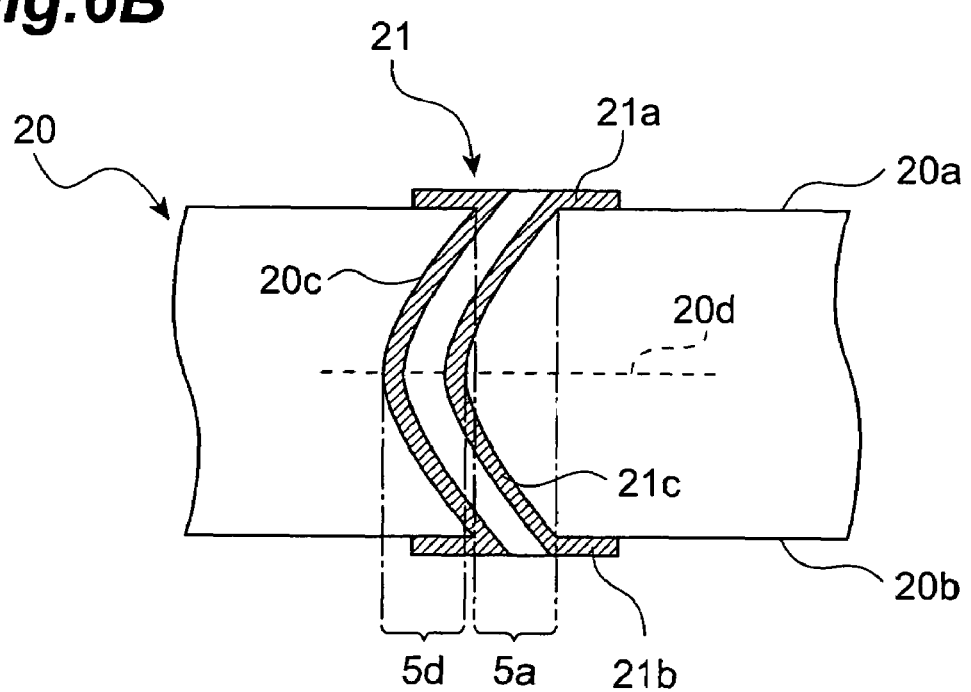

FIGS. 6A and 6B are illustrations showing another example of the configuration of the conductive members provided in the through holes in the wiring substrate, wherein FIG. 6A is a top plan view and FIG. 6B a sectional view taken along a line II-II and in a direction of arrows. These figures show a configuration of a conductive member 21 being a conduction path in the wiring substrate 20.

In the wiring substrate 20, a plurality of (e.g., 4×4=16) through holes 20c are two-dimensionally arrayed, and each through hole is formed in a circular sectional shape. In this configuration example, each through hole 20c, as shown in FIG. 6B, is formed so that the center line thereof is curved relative to the conduction direction normal to the input surface 20a and the output surface 20b of the wiring substrate 20. Specifically, the through hole 20c is formed so that, with respect to a predetermined plane 20d being perpendicular to the conduction direction and located at a predetermined position between the input surface 20a and the output surface 20b, a sectional aperture 5d of the through hole 20c in that plane is formed so as not to be on an extension of the aperture 5a in the input surface 20a. In this configuration, the through hole 20c is arranged not to be seen through from the signal input surface 20a to the signal output surface 20b.

In this configuration example, this through hole 20c is provided with a conductive member 21 for establishing electrical continuity between the input surface 20a and the output surface 20b, as a member formed on the inner wall of the through hole 20c. Namely, a conduction portion 21c is formed on the inner wall in the through hole 20c. An input portion 21a continuous to the conduction portion 21c is formed around the periphery of the through hole 20c on the input surface 20a. An output portion 21b continuous to the conduction portion 21c is formed around the periphery of the through hole 20c on the output surface 20b. These conduction portion 21c, input portion 21a, and output portion 21b constitute the conductive member 21 as a conduction path in the wiring substrate 20.

Figure 7A:
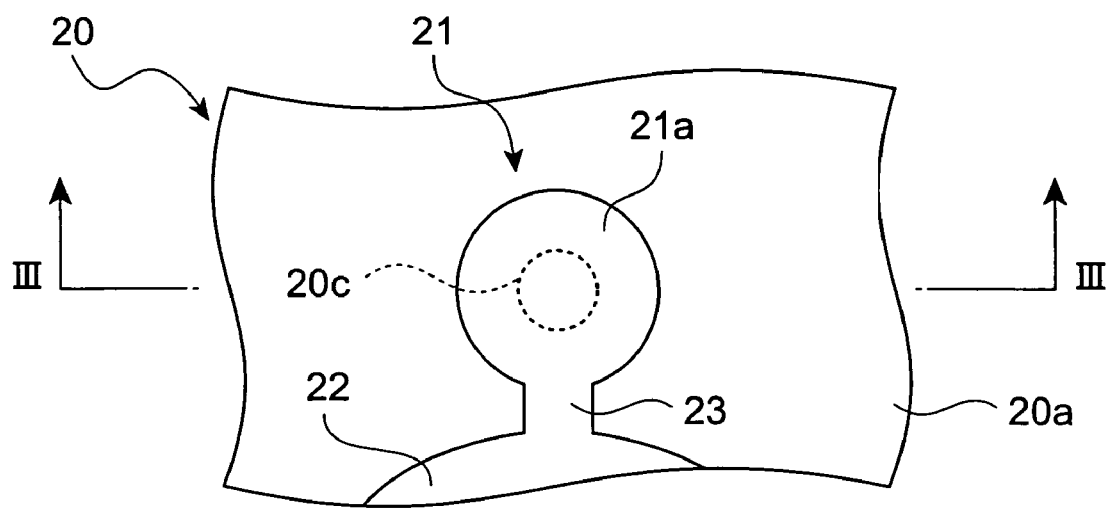
FIGS. 7A and 7B are illustrations showing another example of a configuration of a conductive member provided in a through hole of a wiring substrate.
Figure 7B:
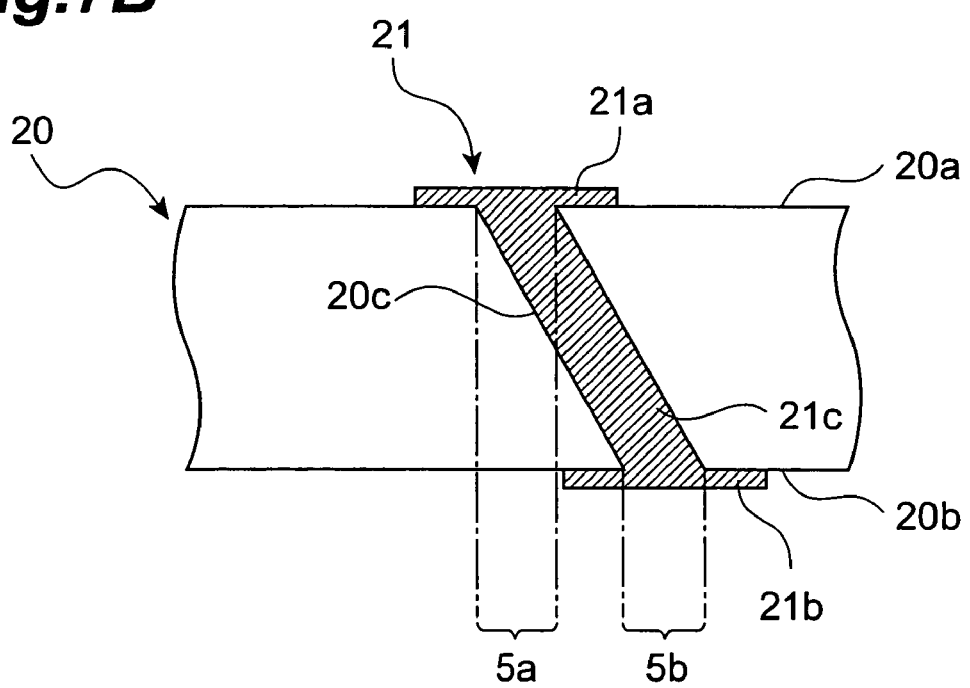

FIGS. 7A and 7B are illustrations showing another example of the configuration of the conductive members provided in the through holes in the wiring substrate, wherein FIG. 7A is a top plan view and FIG. 7B a sectional view taken along a line III-III and in a direction of arrows. These figures show a configuration of a conductive member 21 being a conduction path in the wiring substrate 20. The configuration of the through hole 20c in this configuration example is the same as the configuration shown in FIGS. 5A and 5B.

In this configuration example, this through hole 20c is provided with a conductive member 21 for establishing electrical continuity between the input surface 20a and the output surface 20b, as a member filled inside the through hole 20c. Namely, a conduction portion 21c is filled inside the through hole 20c. An input portion 21a continuous to the conduction portion 21c is formed around the periphery of the through hole 20c on the input surface 20a. An output portion 21b continuous to the conduction portion 21c is formed around the periphery of the through hole 20c on the output surface 20b. These conduction portion 21c, input portion 21a, and output portion 21b constitute the conductive member 21 being a conduction path in the wiring substrate 20.

Figure 8A:
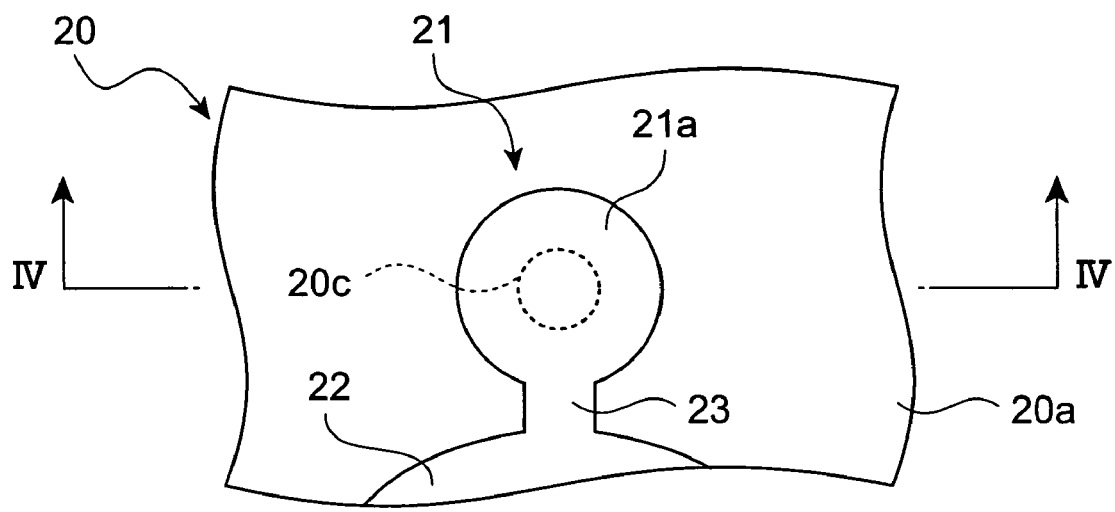
FIGS. 8A and 8B are illustrations showing another example of a configuration of a conductive member provided in a through hole of a wiring substrate.
Figure 8B:
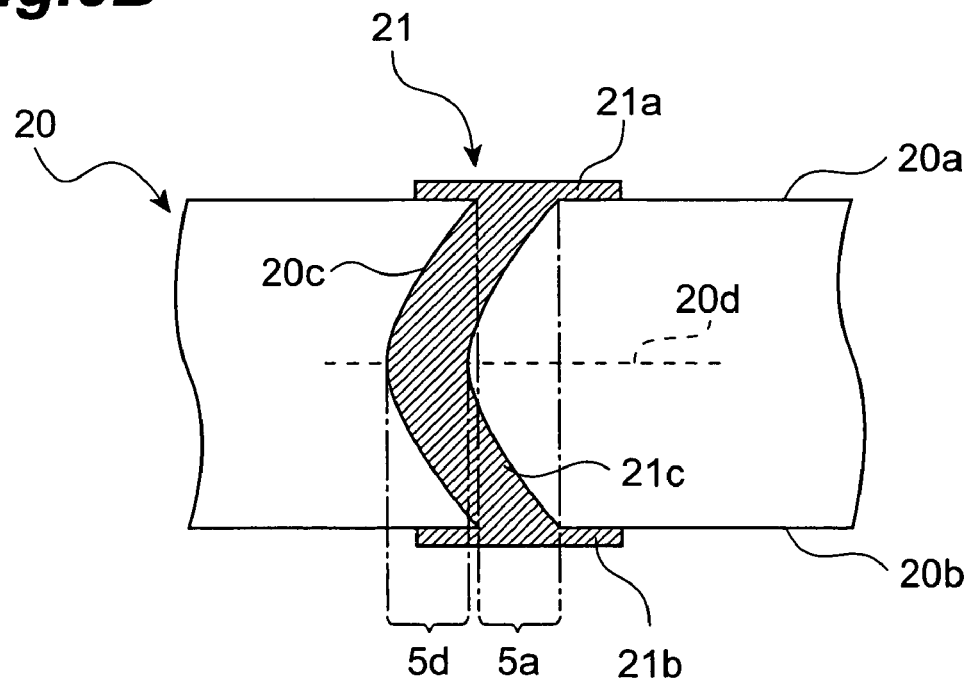

FIGS. 8A and 8B are illustrations showing another example of the configuration of the conductive members provided in the through holes in the wiring substrate, wherein FIG. 8A is a top plan view and FIG. 8B a sectional view taken along a line IV-IV and in a direction of arrows. These figures show a configuration of a conductive member 21 being a conduction path in the wiring substrate 20. The configuration of the through hole 20c in this configuration example is the same as the configuration shown in FIGS. 6A and 6B.

In this configuration example, this through hole 20c is provided with a conductive member 21 for establishing electrical continuity between the input surface 20a and the output surface 20b, as a member filled inside the through hole 20c. Namely, a conduction portion 21c is filled inside the through hole 20c. An input portion 21a continuous to the conduction portion 21c is formed around the periphery of the through hole 20c on the input surface 20a. An output portion 21b continuous to the conduction portion 21c is formed around the periphery of the through hole 20c on the output surface 20b. These conduction portion 21c, input portion 21a, and output portion 21b constitute the conductive member 21 being a conduction path in the wiring substrate 20.

The conductive members formed as conduction paths in the glass substrate having the plurality of through holes can be, for example, of one of the configurations shown in these FIGS. 5A, 5B to 8A, 8B. The arrangement of conduction paths in the glass substrate to become the wiring substrate is preferably set according to the configuration of the radiation detector. One of such configurations is, for example, a configuration wherein through holes at positions necessary for the conduction paths are selected out of the plurality of through holes by a mask or the like and wherein the conductive members are formed therein. Another potential configuration is such that the through holes are selectively formed only at the desired positions of conduction paths.

The glass substrate used for the wiring substrate is not limited to the configuration shown in FIGS. 4A to 4C, but another configuration may be used. For example, FIGS. 4A to 4C show the glass substrate obtained as a capillary substrate made by integrating a plurality of glass members having respective through holes, into a multi-channel member and further integrating a plurality of such multi-channel members. Instead thereof, the capillary substrate may be directly integrally formed from a plurality of glass members. Concerning the shape and arrangement of the individual glass members and multi-channel members, the presence/absence or arrangement or the like of the through holes in the respective members, it is preferable to appropriately use a preferred configuration according to the arrangement of the conduction paths. As for the configuration of the through holes, the sectional shape thereof may be a polygonal shape other than the circular shape, e.g., the square shape.

Next, a production method of the wiring substrate and the radiation detector shown in FIG. 1 will be schematically described together with a specific configuration example thereof.

The first step is to prepare a glass substrate which is made of a glass material having the radiation shielding function, such as lead glass, and in which the through holes arranged not to be seen through from the input surface to the output surface as described above are formed at the predetermined positions. Then the conductive members as conduction paths are formed in the through holes and electric wiring patterns having the necessary electrodes and wirings are further formed on the respective surfaces of the input surface and output surface, thereby preparing the wiring substrate 20 used in the wiring substrate section 2.

Specifically, for the wiring substrate in the wiring substrate section 2, the conductive member 21 consisting of the conduction portion 21c, input portion 21a, and output portion 21b is formed in each through hole 20c provided in the glass substrate; the electrode pads 22 and wirings 23 are formed on the input surface 20a thereof; the electrode pads 24, 29 and wirings 25 are formed on the output surface 20b, thereby forming the wiring substrate 20.

The aforementioned conductive members and electric wiring patterns formed on the glass substrate can be made, for example, from an electroconductive metal layer of titanium nitride (TiN), nickel (Ni), aluminum (Al), chromium (Cr), copper (Cu), silver (Ag), gold (Au), or one of alloys thereof. Such a metal layer may be a single metal layer, or a composite film or a laminate film. As a specific forming method of the metal layer, it is possible to use a method of providing a mask in a desired pattern on a glass substrate, forming a metal film by evaporation (physical vapor deposition (PVD) or chemical vapor deposition (CVD)), plating, or sputtering, and thereafter removing the mask. Bump electrodes are further formed on the wiring substrate 20 according to need in certain cases.

After fabrication of the wiring substrate section 2 consisting of the wiring substrate 20, an IC chip of the signal processing element 30 with bump electrodes 31 thereon is aligned with the electrode pads 24 provided on the output surface 20b of the wiring substrate 20, and they are physically and electrically connected. The PD array 15 with bump electrodes 17 thereon is then aligned with the electrode pads 22 provided on the input surface 20a of the wiring substrate 20, and they are physically and electrically connected.

A bump material for forming the bump electrodes 31, 17 can be, for example, nickel (Ni), copper (Cu), silver (Ag), gold (Au), solder, a resin containing an electroconductive filler, or one of composite materials thereof. In addition, under bump metal (UBM) may be interposed between the bump electrodes and the electrode pads under them.

Subsequently, the housing 40 with bump electrodes 44 thereon is aligned with the electrode pads 29 provided on the output surface 20b of the wiring substrate 20, and they are physically and electrically connected. The above enables the input/output operation of signals from and to an external circuit through the leads 43 provided on the housing 40. Furthermore, the scintillator 10 is mounted through the optical adhesive 11 on the light-incident surface 15a of the PD array 15, thereby obtaining the radiation detector shown in FIG. 1.

Here the PD array 15 provided as a semiconductor photodetecting element array in the radiation detecting section 1 may be of a front incidence type in which the photodiodes are formed on the light-incident surface (front surface) 15a, or of a back incidence type in which the photodiodes are formed on the signal output surface (back surface) 15b. The number, arrangement, etc. of the photodiodes being the photodetecting elements may be optionally set.

The configuration for outputting the detected signals of the photodiodes from the output surface 15b can be, for example, a configuration based on a wiring pattern formed on the output surface 15b, a configuration based on feed-through electrodes formed in the PD array 15, or the like, according to the specific configuration of the PD array.

The radiation detector shown in FIG. 1 uses as a configuration of the radiation detecting section 1, the configuration having the scintillator 10 for generating the scintillation light upon incidence of radiation, and the PD array 15 with photodiodes 16 as semiconductor photodetecting elements for detecting the scintillation light from the scintillator 10. This configuration is a configuration of an indirect detecting type in which the incident radiation such as X-rays is converted into light of a predetermined wavelength (e.g., visible light) by the scintillator 10 and in which thereafter the light is detected by the semiconductor photodetecting elements such as an Si-PD array.

Another possible configuration is such that the radiation detecting section has semiconductor detecting elements for detecting the incident radiation, without provision of the scintillator. This configuration is a configuration of a direct detecting type in which the incident radiation such as X-rays is detected by the semiconductor detecting elements of CdTe or the like. This is equivalent to a configuration obtained, for example, by eliminating the scintillator 10 from the configuration of FIG. 1 and replacing the PD array 15 by a semiconductor detecting element array.

For the connection between the wiring substrate section 2 and the radiation detecting section 1, the connection between the wiring substrate section 2 and the signal processing section 3, etc., it is preferable to use the direct bonding method by electric connection through the bump electrodes, as in the above embodiments. Each of the sections can be suitably electrically connected by using such metal bump electrodes as electric connection means.

Other potential configurations than the configuration using such bump electrodes include a configuration in which an under-fill resin is charged after connection with the bump electrodes, configurations by anisotropic conductive film (ACF) method, anisotropic conductive paste (ACP) method, and non-conductive paste (NCP) method, and so on. For each of the substrates, a passivation film made of an insulating material may be formed in an opening state of the electrode pads if necessary.

INDUSTRIAL APPLICABILITY

The wiring substrate, and the radiation detector using it according to the present invention are applicable as a wiring substrate and a radiation detector capable of suppressing the transmission of radiation. Namely, the wiring substrate used for electrical connection between the radiation detecting means and the signal processing means in the radiation detector and others is constructed using the glass substrate made of the predetermined glass material, and each through hole as a conduction path provided in the glass substrate is arranged so that the aperture in the predetermined plane is not on the extension of the aperture in the signal input surface, i.e., so that the through hole cannot be seen through from the signal input surface to the signal output surface when viewed from the conduction direction perpendicular to the signal input surface; whereby the glass material having the radiation shielding function is present somewhere between the signal input surface and the signal output surface, when viewed from the conduction direction, even in the region where the through hole is provided in the glass substrate. This substantializes the wiring substrate capable of suppressing the transmission of radiation in total.

In the radiation detector in which the wiring substrate of the above configuration is applied to the wiring substrate section, the glass material having the radiation shielding function is present at least in a part of the path from the signal input surface to the signal output surface, everywhere in the wiring substrate section. This prevents the radiation from entering the signal processing element, and substantializes the radiation detector capable of suppressing the degradation of the reliability and lifetime due to the radiation damage.

The invention claimed is:

1. A wiring substrate provided with a conduction path for guiding an electric signal between a signal input surface and a signal output surface,
the wiring substrate comprising a glass substrate made of a predetermined glass material having a radiation shielding function, and provided with a through hole, and a conductive member provided in the through hole and establishing electrical continuity between the input surface and the output surface to function as the conduction path,
wherein the through hole in the glass substrate is formed so that an aperture of the through hole in a predetermined plane perpendicular to a conduction direction from the signal input surface toward the signal output surface is within a region except for a region on an extension along the conduction direction of an aperture of the through hole in the signal input surface.

2. The wiring substrate according to claim 1, wherein the through hole in the glass substrate is formed so that a center line thereof is inclined at a predetermined angle relative to the conduction direction.

3. The wiring substrate according to claim 1, wherein the through hole in the glass substrate is formed so that a center line thereof is curved relative to the conduction direction.

4. The wiring substrate according to claim 1, wherein the glass substrate is made of the glass material containing lead.

5. The wiring substrate according to claim 1, wherein the conductive member is provided so as to be formed on an inner wall of the through hole in the glass substrate.

6. The wiring substrate according to claim 1, wherein the conductive member is provided so as to be filled inside the through hole in the glass substrate.

7. The wiring substrate according to claim 1, wherein the glass substrate is a glass substrate with a plurality of said through holes made by fusing together and integrally forming a plurality of hollow glass members opening at both ends.

8. A radiation detector comprising:
radiation detecting means for detecting an incident radiation and outputting a detected signal;
signal processing means for processing the detected signal from the radiation detecting means; and
a wiring substrate section having the wiring substrate as set forth in claim 1, provided with the conduction path for guiding the detected signal between the signal input surface and the signal output surface, in which the radiation detecting means and the signal processing means are connected to the signal input surface and to the signal output surface, respectively;
wherein the radiation detecting means, the wiring substrate section, and the signal processing means are arranged in that order along a predetermined alignment direction substantially coincident with the conduction direction in the wiring substrate.

9. The radiation detector according to claim 8, wherein the radiation detecting means has a scintillator for generating scintillation light upon incidence of the radiation, and a semiconductor photodecting element for detecting scintillation light from the scintillator.

10. The raditation detector according to claim 8, wherein the radiation detecting means has a semiconductor detecting element for detecting the incident radiation.

11. The radiation detector according to claim 8, wherein at least one of a set of the wiring substrate section and the radiation detecting means, and a set of the wiring substrate section and the signal processing means are electrically connected through a bump electrode.

* * * * *